United States Patent
Zhu

(10) Patent No.: US 11,217,493 B2
(45) Date of Patent: Jan. 4, 2022

(54) SEMICONDUCTOR DEVICE, METHOD OF MANUFACTURING THE SAME AND ELECTRONIC DEVICE INCLUDING THE DEVICE

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 16/860,707

(22) Filed: Apr. 28, 2020

(65) Prior Publication Data

US 2020/0280700 A1 Sep. 3, 2020

Related U.S. Application Data

(62) Division of application No. 15/718,586, filed on Sep. 28, 2017, now Pat. No. 10,714,398.

(30) Foreign Application Priority Data

Sep. 30, 2016 (CN) .......................... 201610872541.2

(51) Int. Cl.
*H01L 21/8238* (2006.01)
*H01L 21/8234* (2006.01)
(Continued)

(52) U.S. Cl.
CPC ...... *H01L 21/823885* (2013.01); *B82Y 10/00* (2013.01); *G05B 23/0216* (2013.01);
(Continued)

(58) Field of Classification Search
CPC ......... H01L 21/823885; H01L 29/0653; H01L 29/66712; H01L 29/7813; H01L 29/7848;
(Continued)

(56) References Cited

U.S. PATENT DOCUMENTS

| 5,554,870 A | 9/1996 | Fitch et al. |
| 6,943,407 B2 | 9/2005 | Ouyang et al. |

(Continued)

FOREIGN PATENT DOCUMENTS

| CN | 1794466 A | 6/2006 |
| CN | 1901225 A | 1/2007 |

(Continued)

OTHER PUBLICATIONS

US 10,468,312 B2, 11/2019, Zhu et al. (withdrawn)
(Continued)

*Primary Examiner* — Julia Slutsker
(74) *Attorney, Agent, or Firm* — Schwegman Lundberg & Woessner, P.A.

(57) ABSTRACT

There are provided a semiconductor device, a method of manufacturing the same, and an electronic device including the device. According to an embodiment, the semiconductor device may include a substrate; a first source/drain layer, a channel layer and a second source/drain layer stacked on the substrate in sequence, wherein the second source/drain layer comprises a first semiconductor material which is stressed; and a gate stack surrounding a periphery of the channel layer.

10 Claims, 17 Drawing Sheets

(51) Int. Cl.

| | | |
|---|---|---|
| *B82Y 10/00* | (2011.01) | |
| *H01L 29/06* | (2006.01) | |
| *H01L 29/267* | (2006.01) | |
| *H01L 29/417* | (2006.01) | |
| *H01L 29/66* | (2006.01) | |
| *H01L 29/775* | (2006.01) | |
| *H01L 29/786* | (2006.01) | |
| *H01L 29/10* | (2006.01) | |
| *H01L 29/78* | (2006.01) | |
| *G05B 23/02* | (2006.01) | |
| *G06T 19/00* | (2011.01) | |
| *H04N 5/232* | (2006.01) | |
| *H04N 7/18* | (2006.01) | |
| *H01L 21/02* | (2006.01) | |
| *H01L 21/3065* | (2006.01) | |
| *H01L 29/04* | (2006.01) | |
| *H01L 29/165* | (2006.01) | |
| *H01L 29/423* | (2006.01) | |
| *H01L 21/225* | (2006.01) | |
| *H01L 21/324* | (2006.01) | |
| *H01L 29/08* | (2006.01) | |
| *H01L 29/15* | (2006.01) | |
| *H01L 29/205* | (2006.01) | |
| *H01L 29/45* | (2006.01) | |
| *H01L 29/778* | (2006.01) | |
| *H01L 21/308* | (2006.01) | |
| *H01L 21/822* | (2006.01) | |
| *H01L 27/092* | (2006.01) | |
| *H04N 13/332* | (2018.01) | |
| *H04N 13/111* | (2018.01) | |
| *H04N 13/366* | (2018.01) | |
| *H04N 13/398* | (2018.01) | |
| *G06F 3/0481* | (2013.01) | |
| *G06F 3/0482* | (2013.01) | |
| *G06K 9/00* | (2006.01) | |
| *H04N 5/247* | (2006.01) | |
| *H01L 21/3105* | (2006.01) | |

(52) U.S. Cl.
CPC ...... *G06T 19/006* (2013.01); *H01L 21/02532* (2013.01); *H01L 21/02636* (2013.01); *H01L 21/2252* (2013.01); *H01L 21/2258* (2013.01); *H01L 21/3065* (2013.01); *H01L 21/3083* (2013.01); *H01L 21/324* (2013.01); *H01L 21/8221* (2013.01); *H01L 21/82345* (2013.01); *H01L 21/823412* (2013.01); *H01L 21/823418* (2013.01); *H01L 21/823475* (2013.01); *H01L 21/823487* (2013.01); *H01L 21/823807* (2013.01); *H01L 21/823814* (2013.01); *H01L 21/823842* (2013.01); *H01L 21/823864* (2013.01); *H01L 21/823871* (2013.01); *H01L 27/092* (2013.01); *H01L 29/04* (2013.01); *H01L 29/0638* (2013.01); *H01L 29/0653* (2013.01); *H01L 29/0676* (2013.01); *H01L 29/0847* (2013.01); *H01L 29/1037* (2013.01); *H01L 29/1054* (2013.01); *H01L 29/1083* (2013.01); *H01L 29/1095* (2013.01); *H01L 29/152* (2013.01); *H01L 29/165* (2013.01); *H01L 29/205* (2013.01); *H01L 29/267* (2013.01); *H01L 29/41741* (2013.01); *H01L 29/42376* (2013.01); *H01L 29/42392* (2013.01); *H01L 29/45* (2013.01); *H01L 29/6656* (2013.01); *H01L 29/66431* (2013.01); *H01L 29/66439* (2013.01); *H01L 29/66462* (2013.01); *H01L 29/66469* (2013.01); *H01L 29/66522* (2013.01); *H01L 29/66666* (2013.01); *H01L 29/66712* (2013.01); *H01L 29/66742* (2013.01); *H01L 29/775* (2013.01); *H01L 29/7788* (2013.01); *H01L 29/7813* (2013.01); *H01L 29/7827* (2013.01); *H01L 29/7848* (2013.01); *H01L 29/78642* (2013.01); *H04N 5/23238* (2013.01); *H04N 7/181* (2013.01); *G05B 2219/32014* (2013.01); *G06F 3/0482* (2013.01); *G06F 3/04817* (2013.01); *G06K 9/00711* (2013.01); *G06K 2009/00738* (2013.01); *G06K 2209/19* (2013.01); *H01L 21/31053* (2013.01); *H01L 29/0649* (2013.01); *H04N 5/247* (2013.01); *H04N 13/111* (2018.05); *H04N 13/332* (2018.05); *H04N 13/366* (2018.05); *H04N 13/398* (2018.05)

(58) Field of Classification Search
CPC ............ H01L 29/0638; H01L 29/1083; H01L 29/0676; H01L 29/41741; H01L 29/66439; H01L 29/66469; H01L 29/66742; H01L 29/775; H01L 29/78642; H01L 21/823412; H01L 21/823418; H01L 21/82345; H01L 29/1095
See application file for complete search history.

(56) References Cited

U.S. PATENT DOCUMENTS

| | | | |
|---|---|---|---|
| 7,781,827 | B2 | 8/2010 | Rao |
| 9,196,730 | B1* | 11/2015 | Yu ..................... H01L 29/42372 |
| 9,502,519 | B2 | 11/2016 | Chen et al. |
| 9,799,655 | B1 | 10/2017 | Cheng et al. |
| 10,020,396 | B2 | 7/2018 | Cantoro et al. |
| 10,629,498 | B2 | 4/2020 | Zhu et al. |
| 10,643,905 | B2 | 5/2020 | Zhu et al. |
| 10,714,398 | B2 | 7/2020 | Zhu |
| 10,910,278 | B2 | 2/2021 | Zhu et al. |
| 2002/0076884 | A1 | 6/2002 | Weis |
| 2003/0116792 | A1 | 6/2003 | Chen et al. |
| 2003/0215989 | A1 | 11/2003 | Kim et al. |
| 2004/0157353 | A1 | 8/2004 | Ouyang et al. |
| 2006/0226495 | A1 | 10/2006 | Kwon |
| 2008/0179664 | A1 | 7/2008 | Rao |
| 2011/0012085 | A1 | 1/2011 | Deligianni et al. |
| 2012/0104508 | A1 | 5/2012 | Zhu et al. |
| 2012/0319201 | A1 | 12/2012 | Sun et al. |
| 2013/0082333 | A1 | 4/2013 | Chen et al. |
| 2014/0175561 | A1 | 6/2014 | Colinge et al. |
| 2014/0264289 | A1 | 9/2014 | Chuang et al. |
| 2015/0017767 | A1* | 1/2015 | Masuoka ............ H01L 27/1116 438/211 |
| 2015/0263094 | A1 | 9/2015 | Diaz et al. |
| 2015/0380555 | A1 | 12/2015 | Ohtou et al. |
| 2016/0005850 | A1 | 1/2016 | Zhao et al. |
| 2016/0049397 | A1 | 2/2016 | Chang et al. |
| 2016/0064541 | A1* | 3/2016 | Diaz ..................... H01L 27/092 257/329 |
| 2016/0204251 | A1* | 7/2016 | Masuoka ........ H01L 21/823842 257/329 |
| 2016/0211368 | A1 | 7/2016 | Chen et al. |
| 2016/0315084 | A1 | 10/2016 | Wu et al. |
| 2016/0336324 | A1 | 11/2016 | Li et al. |
| 2016/0372316 | A1 | 12/2016 | Yang et al. |
| 2017/0077231 | A1 | 3/2017 | Balakrishnan et al. |
| 2018/0040740 | A1 | 2/2018 | Cantoro et al. |
| 2018/0097065 | A1 | 4/2018 | Zhu |
| 2018/0097106 | A1 | 4/2018 | Zhu |
| 2018/0108577 | A1 | 4/2018 | Zhu et al. |
| 2018/0254322 | A1 | 9/2018 | Cheng et al. |

(56) References Cited

U.S. PATENT DOCUMENTS

2019/0287865 A1 9/2019 Zhu et al.
2020/0203343 A1 6/2020 Zhu et al.

FOREIGN PATENT DOCUMENTS

| | | |
|---|---|---|
| CN | 1906769 A | 1/2007 |
| CN | 101017825 A | 8/2007 |
| CN | 101295647 A | 10/2008 |
| CN | 101399207 A | 4/2009 |
| CN | 100521242 C | 7/2009 |
| CN | 101872778 A | 10/2010 |
| CN | 102412156 A | 4/2012 |
| CN | 103337519 A | 10/2013 |
| CN | 103515435 A | 1/2014 |
| CN | 103996709 A | 8/2014 |
| CN | 104103515 A | 10/2014 |
| CN | 104701376 A | 6/2015 |
| CN | 104916677 A | 9/2015 |
| CN | 105206670 A | 12/2015 |
| CN | 105280705 A | 1/2016 |
| CN | 105810720 A | 7/2016 |
| EP | 0899790 A2 | 3/1999 |
| KR | 20090066491 A | 6/2009 |

OTHER PUBLICATIONS

US 10,566,249 B2, 02/2020, Zhu et al. (withdrawn)
US 10,600,696 B2, 03/2020, Zhu et al. (withdrawn)
US 10,679,907 B1, 06/2020, Zhu (withdrawn)
"U.S. Appl. No. 16/810,223, Restriction Requirement dated Sep. 4, 2020", 5 pgs.
"U.S. Appl. No. 15/720,240, Response filed Sep. 21, 2020 to Non Final Office Action dated Jun. 23, 2020", 15 pgs.
"U.S. Appl. No. 15/720,240, Notice of Allowance dated Sep. 30, 2020", 8 pgs.
"U.S. Appl. No. 16/810,223, Response filed Oct. 26, 2020 to Restriction Requirement dated Sep. 4, 2020", 9 pgs.
"U.S. Appl. No. 16/810,223, Non Final Office Action dated Nov. 13, 2020", 9 pgs.
"U.S. Appl. No. 16/810,223, Corrected Notice of Allowability dated Apr. 23, 2021", 6 pgs.
"U.S. Appl. No. 16/810,223, Notice of Allowance dated Apr. 2, 2021", 8 pgs.
"U.S. Appl. No. 16/810,223, Response filed Feb. 11, 2021 to Non Final Office Action dated Nov. 13, 2020", 10 pgs.
"U.S. Appl. No. 15/718,586, Corrected Notice of Allowability dated Jun. 10, 2020", 2 pgs.
"U.S. Appl. No. 15/720,240, Non Final Office Action dated Jun. 23, 2020", 13 pgs.
"U.S. Appl. No. 16/338,169, Non Final Office Action dated Jun. 11, 2020", (Jun. 11, 2020), 39 pgs.
"U.S. Appl. No. 15/718,586, Advisory Action dated Feb. 3, 2020", 3 pgs.
"U.S. Appl. No. 15/718,586, Corrected Notice of Allowability dated May 14, 2020", 2 pgs.
"U.S. Appl. No. 15/718,586, Corrected Notice of Allowability dated May 16, 2019", 4 pgs.
"U.S. Appl. No. 15/718,586, Final Office Action dated Nov. 14, 2019", 16 pgs.
"U.S. Appl. No. 15/718,586, Non Final Office Action dated Jun. 26, 2019", 19 pgs.
"U.S. Appl. No. 15/718,586, Non Final Office Action dated Dec. 12, 2018", 12 pgs.
"U.S. Appl. No. 15/718,586, Notice of Allowance dated Mar. 25, 2020", 8 pgs.
"U.S. Appl. No. 15/718,586, Notice of Allowance dated May 6, 2019", 8 pgs.
"U.S. Appl. No. 15/718,586, Response filed Jan. 13, 2020 to Final Office Action dated Nov. 14, 2019", 11 pgs.
"U.S. Appl. No. 15/718,586, Response filed Feb. 12, 2020 to Advisory Action dated Feb. 3, 2020", 10 pgs.
"U.S. Appl. No. 15/718,586, Response filed Nov. 14, 2018 to Restriction Requirement dated Oct. 2, 2018", 9 pgs.
"U.S. Appl. No. 15/718,586, Response filed Apr. 3, 2019 to Non-Final Office Action dated Dec. 12, 2018", 12 pgs.
"U.S. Appl. No. 15/718,586, Response filed Sep. 26, 2019 to Non-Final Office Action dated Jun. 26, 2019", 9 pgs.
"U.S. Appl. No. 15/718,586, Restriction Requirement dated Oct. 2, 2018", 6 pgs.
"U.S. Appl. No. 15/720,240, Advisory Action dated May 1, 2020", 3 pgs.
"U.S. Appl. No. 15/720,240, Final Office Action dated Feb. 24, 2020", 14 pgs.
"U.S. Appl. No. 15/720,240, Non Final Office Action dated Aug. 26, 2019", 14 pgs.
"U.S. Appl. No. 15/720,240, Response filed Apr. 24, 2020 to Final Office Action dated Feb. 24, 2020", 12 pgs.
"U.S. Appl. No. 15/720,240, Response filed Nov. 26, 2019 to Non-Final Office Action dated Aug. 26, 2019", 13 pgs.
"U.S. Appl. No. 15/720,240, Response filed May 21, 2019 to Restriction Requirement dated Mar. 22, 2019", 10 pgs.
"U.S. Appl. No. 15/720,240, Restriction Requirement dated Mar. 22, 2019", 6 pgs.
"U.S. Appl. No. 15/722,423, Non Final Office Action dated Jan. 10, 2019", 8 pgs.
"U.S. Appl. No. 15/722,423, Notice of Allowance dated May 8, 2019", 7 pgs.
"U.S. Appl. No. 15/722,423, Notice of Allowance dated Jun. 28, 2019", 8 pgs.
"U.S. Appl. No. 15/722,423, Notice of Allowance dated Dec. 4, 2019", 8 pgs.
"U.S. Appl. No. 15/722,423, Response filed Nov. 14, 2018 to Restriction Requirement dated Oct. 18, 2018", 11 pgs.
"U.S. Appl. No. 15/722,423, Response filed Apr. 10, 2019 to Non-Final Office Action dated Jan. 10, 2019", 12 pgs.
"U.S. Appl. No. 15/722,423, Restriction Requirement dated Oct. 18, 2018", 6 pgs.
"U.S. Appl. No. 16/421,009, Corrected Notice of Allowability dated Feb. 24, 2020", 2 pgs.
"U.S. Appl. No. 16/421,009, Corrected Notice of Allowability dated Apr. 3, 2020", 2 pgs.
"U.S. Appl. No. 16/421,009, Notice of Allowance dated Oct. 9, 2019", 9 pgs.
"Chinese Application No. 201710530250.X, Office Action dated Apr. 15, 2020", w/ English Translation, (Apr. 15, 2020), 13 pgs.
"Chinese Application No. 201710530297.6, Office Action dated Apr. 15, 2020", w/ English Translation, (Apr. 15, 2020), 12 pgs.
"Chinese Application No. 201710530298.0, Office Action dated Mar. 31, 2020", w/ English Translation, (Mar. 31, 2020), 20 pgs.
"Chinese Application No. 201710530685.4, Office Action dated Apr. 15, 2020", w/ English Translation, (Apr. 15, 2020), 10 pgs.
"Chinese Application No. 201710530950.9, Office Action dated Apr. 20, 2020", w/ English Translation, (Apr. 20, 2020), 11 pgs.
"Chinese Application No. 201710531811.8, Office Action dated Apr. 21, 2020", w/ English Translation, (Apr. 21, 2020), 4 pgs.
"Chinese Application Serial No. 201710530194.X, Office Action datedd Nov. 25, 2019", (Nov. 25, 2019), 8 pgs.
"Chinese Application Serial No. 201710530250.X, Office Action dated Apr. 3, 2019", w/Concise Statement of Relevance, (Apr. 3, 2019), 8 pgs.
"Chinese Application Serial No. 201710530250.X, Office Action dated Nov. 14, 2019", (Nov. 14, 2019), 7 pgs.
"Chinese Application Serial No. 201710530297.6, Office Action dated Aug. 28, 2019", w/Concise Statement of Relevance, (Aug. 28, 2019), 8 pgs.
"Chinese Application Serial No. 201710530298.0, Office Action dated May 22, 2019", w/Concise Statement of Relevance, (May 22, 2019), 12 pgs.
"Chinese Application Serial No. 201710530684.X, Office Action dated Nov. 4, 2019", w/o English translation, (Nov. 4, 2019), 7 pgs.

(56) References Cited

OTHER PUBLICATIONS

"Chinese Application Serial No. 201710530685.4, Office Action dated Aug. 28, 2019", w/Concise Statement of Relevance, (Aug. 28, 2019), 8 pgs.
"Chinese Application Serial No. 201710530751.8, Office Action dated Oct. 9, 2019", w/English Translation, (Oct. 9, 2019), 10 pgs.
"Chinese Application Serial No. 201710530950.9, Office Action dated Nov. 14, 2019", (Nov. 14, 2019), 7 pgs.
"Chinese Application Serial No. 201710531762.8, Office Action dated Nov. 4, 2019", (Nov. 4, 2019), 15 pgs.
"Chinese Application Serial No. 201710531811.8 , Office Action dated Oct. 24, 2019", w/Concise Statement of Relevance, 9 pgs.
"Chinese Application Serial No. 201710531812.2, Office Action dated May 21, 2019", w/Concise Statement of Relevance, (May 21, 2019), 12 pgs.
Clay, Simon, "Semiconductor Germanium Materials and Devices", Beijing: Metallurgical Industry Press, (Apr. 2010), 10 pgs.

\* cited by examiner

SEMICONDUCTOR DEVICE, METHOD OF MANUFACTURING THE SAME AND ELECTRONIC DEVICE INCLUDING THE DEVICE

CROSS-REFERENCE TO RELATED APPLICATION(S)

This application is divisional of and claims the benefit of priority of U.S. application Ser. No. 15/718,586, filed Sep. 28, 2017, which claims priority to Chinese Application No. 201610872541.2, filed on Sep. 30, 2016, entitled "SEMICONDUCTOR DEVICE, METHOD OF MANUFACTURING THE SAME AND ELECTRONIC DEVICE INCLUDING THE DEVICE," each of which are incorporated herein by reference in their entireties.

TECHNICAL FIELD

The present disclosure relates generally to the semiconductor field, and more particularly, to a vertical semiconductor device, a method of manufacturing the same, and an electronic device including the semiconductor device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device.

SUMMARY

In view of the above, the present disclosure aims to provide, among others, a vertical semiconductor device which can provide improved characteristics, a method of manufacturing the same, and an electronic device including the semiconductor device.

According to an aspect of the present disclosure, there is provided a semiconductor device, comprising: a substrate; a first source/drain layer, a channel layer and a second source/drain layer stacked on the substrate in sequence, wherein the second source/drain layer comprises a first semiconductor material which is stressed; and a gate stack surrounding a periphery of the channel layer.

According to a further aspect of the present disclosure, there is provided a method of manufacturing a semiconductor device, comprising: disposing a stack of a first source/drain layer, a channel layer and a second source/drain layer on a substrate; defining an active region of the semiconductor device in the first source/drain layer, the channel layer and the second source/drain layer; forming a gate stack surrounding a periphery of the channel layer; and introducing a semiconductor layer which is stressed into the second source/drain layer.

According to a further aspect of the present disclosure, there is provided an electronic device comprising an Integrated Circuit (IC) comprising the above described semiconductor device.

According to embodiments of the present disclosure, the second source/drain layer may include a stressed material, thereby creating stress in the channel to further improve device performances.

In addition, the gate stack surrounds the periphery of the channel layer and the channel is formed in the channel layer. Thus, the gate length is determined substantially by the thickness of the channel layer. The channel layer may be formed by, for example, epitaxy, and thus the thickness thereof can be well controlled. Therefore, the gate length can be well controlled. The periphery of the channel layer may be recessed inwards with respect to that of the first source/drain layer and the second source/drain layer, so that the gate stack can be embedded into the recess, to reduce or even avoid overlap with the source/drain regions and thus contribute to reduced parasitic capacitance between the gate and the source/drain. Further, the channel layer may comprise a single-crystalline semiconductor material, resulting in improved carrier mobility and lower current leakage and thus enhanced device performances.

BRIEF DESCRIPTION OF THE DRAWINGS

The above and other objects, features, and advantages of the present disclosure will become more apparent from following descriptions on embodiments thereof with reference to attached drawings, in which.

Throughout the drawings, like or similar reference numerals denote like or similar elements.

DETAILED DESCRIPTION

Figure 1:
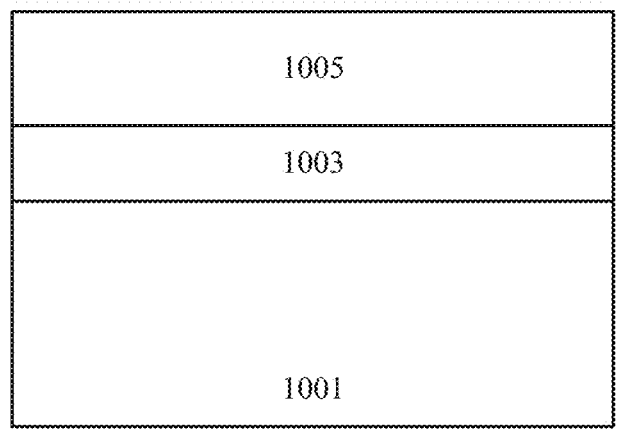
FIGS. 1-20 are schematic views showing a flow of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

A vertical semiconductor device according to embodiments of the present disclosure may include a first source/ drain layer, a channel layer and a second source/drain layer stacked on a substrate in sequence. The respective layers may be contiguous to each other, or there may also be another semiconductor layer therebetween, for example, a leakage suppression layer and/or an ON current enhancement layer (i.e., a semiconductor layer having a band gap greater than or less than that of an adjacent layer). Source/drain regions of the device may be formed in the first source/drain layer and the second source/drain layer, while a channel region of the device may be formed in the channel layer. A conductive channel may be formed through the channel region between the source/drain regions on opposite ends of the channel region. A gate stack may be formed to surround a periphery of the channel layer. As a result, a gate length may be determined substantially by the thickness of the channel layer itself, rather than depending on timing etching as in the conventional art. The channel layer may be formed by, for example, epitaxy, and thus the thickness thereof can be well controlled. Therefore, the gate length can be well controlled.

The channel layer may have its periphery recessed to that of the first source/drain layer and the second source/drain layer. Then, the formed gate stack may be embedded into a recess of the channel layer with respect to the first source/drain layer and the second source/drain layer. Preferably, an extent of the gate stack in a stack direction (a vertical direction, for example, approximately perpendicular to a surface of the substrate) of the first source/drain layer, the channel layer and the second source/drain layer is within an extent of the recess in that direction. Thereby, overlap of the gate with the source/drain regions can be reduced or even avoided, thus contributing to reduced parasitic capacitance between the gate and the source/drain.

According to embodiments of the present disclosure, the second source/drain layer may include a stressed semiconductor material (which may be referred to as a "first semiconductor material") to create stress in the channel layer. The stressed semiconductor material may be contiguous to the channel layer, or there may be an intermediate layer between the stressed semiconductor layer and the channel layer (for example, as a seed layer for growing the stressed semiconductor layer, which may be referred to as a "second semiconductor material.") The stressed first semiconductor material may create stress in a current flow direction (here, a vertical direction) in the device. For a p-type device, the stressed semiconductor material may create compressive stress in the channel layer in the current flow direction; and for an n-type device, the stressed semiconductor material may create tensile stress in the channel layer in the current flow direction. For example, a lattice constant of the first semiconductor material without being strained may be greater than that of the second semiconductor material without being strained, resulting in compressive stress in the channel layer (especially for the p-type device); or the lattice constant of the first semiconductor material without being strained may be less than that of the second semiconductor material without being strained, resulting in tensile stress in the channel layer (especially for the n-type device). For example, for the p-type device, the first semiconductor material is first SiGe, the second semiconductor material is second SiGe, and a concentration of Ge in the first SiGe is greater than that in the second SiGe. Alternatively, for the n-type device, the first semiconductor material is first SiGe, the second semiconductor material is second SiGe, and a concentration of Ge in the first SiGe is less than that in the second SiGe.

The channel layer may be made of a single-crystalline semiconductor material to improve device performances. Of course, the first source/drain layer and the second source/drain layer may also be made of a single-crystalline semiconductor material. In this case, the single-crystalline semiconductor material of the channel layer and the single-crystalline semiconductor material of the source/drain layers may be a cocrystal. Mobility of electrons or holes in the single-crystalline semiconductor material of the channel layer may be greater than that in the first source/drain layer and the second source/drain layer (especially a portion thereof contiguous to the channel layer, for example, the above described intermediate layer). Further, a forbidden band gap of the first source/drain layer and the second source/drain layer (especially a portion thereof contiguous to the channel layer, for example, the above described intermediate layer) may be greater than that of the single-crystalline semiconductor material of the channel layer.

According to embodiments of the present disclosure, the single-crystalline semiconductor material of the channel layer may have the same crystal structure as the first source/drain layer and the second source/drain layer (especially a portion thereof contiguous to the channel layer, for example, the above described intermediate layer). In this case, a lattice constant of the first source/drain layer and the second source/drain layer (especially a portion thereof contiguous to the channel layer, for example, the above described intermediate layer) without being strained may be greater than that of the single-crystalline semiconductor material of the channel layer without being strained. Then, mobility of carriers in the single-crystalline semiconductor material of the channel layer may be greater than that if without being strained, or an effective mass of light carriers in the single-crystalline semiconductor material of the channel layer may be less than that if without being strained, or a concentration of light carriers in the single-crystalline semiconductor material of the channel layer may be greater than that if without being strained. Alternatively, a lattice constant of the first source/drain layer and the second source/drain layer (especially a portion thereof contiguous to the channel layer, for example, the above described intermediate layer) without being strained may be less than a lattice constant of the single-crystalline semiconductor material of the channel layer without being strained. Then, mobility of electrons in the single-crystalline semiconductor material of the channel layer may be greater than that if without being strained, or an effective mass of electrons in the single-crystalline semiconductor material of the channel layer may be less than that if without being strained.

According to embodiments of the present disclosure, doping of the source/drain regions may move partially into end portions of the channel layer close to the first source/drain layer and the second source/drain layer. As a result, there may be a doping distribution in the end portions of the channel layer close to the first source/drain layer and the second source/drain layer, while helps reducing resistance between the source/drain region and the channel region when the device is ON and thus improving the device performances.

According to embodiments of the present disclosure, the channel layer may comprise a semiconductor material different from that of the first source/drain layer and the second source/drain layer (especially a portion thereof contiguous to the channel layer, for example, the above described intermediate layer). Thus, it facilitates processing the channel layer by, for example, selective etching, to recess the channel layer with respect to the first source/drain layer and the second source/drain layer. Further, the first source/drain layer and the second source/drain layer (especially a portion thereof contiguous to the channel layer, for example, the above described intermediate layer) may comprise the same semiconductor material as each other.

For example, the first source/drain layer may be the semiconductor substrate per se. In this case, the channel layer may be a semiconductor layer epitaxially grown on the substrate, and the second source/drain layer may be a semiconductor layer epitaxially grown on the channel layer. Alternatively, the first source/drain layer may be a semiconductor layer epitaxially grown on the substrate. In this case, the channel layer may be a semiconductor layer epitaxially grown on the first source/drain layer, and the second source/drain layer may be a semiconductor layer epitaxially grown on the channel layer.

According to embodiments of the present disclosure, a liner may be disposed on surfaces of the first source/drain layer and the second source/drain layer. The liner may even be stressed. For example, for an n-type device, the liner may be compressive stressed to create tensile stress in the channel layer; and for a p-type device, the liner may be tensile stressed to create compressive stress in the channel layer. As a result, the device performances can be further improved.

Such a semiconductor device may be manufactured as follows. Specifically, a stack of a first source/drain layer, a channel layer and a second source/drain layer may be provided on the substrate. As described above, the first source/drain layer may be provided by the substrate per se or through epitaxy on the substrate. Then, the channel layer may be epitaxially grown on the first source/drain layer, and the second source/drain layer may be epitaxially grown on the channel layer. The channel layer may have its thickness well controlled in the epitaxy process. Since the respective layers are epitaxially grown respectively, there may be a clear crystal interface between at least a pair of adjacent layers. Further, the respective layers may be doped respectively, and then there may be a doping concentration interface between at least a pair of adjacent layers.

For the first source/drain layer, the channel layer and the second source/drain layer which are stacked, an active region may be defined therein. For example, those layers may be selectively etched in sequence into a desired shape. Generally, the active region may have a pillar shape (for example, a cylindrical shape). The etching of the first source/drain layer may be performed with respect to only an upper portion of first source/drain layer, so that a lower portion of the first source/drain layer may extend beyond the periphery of the upper portion, for convenience of connection to the source/drain region formed in the first source/drain layer in subsequent processes. Then, a gate stack may be formed to surround a periphery of the channel layer.

Further, the periphery of the channel layers may be recessed with respect to that of the first source/drain layer and the second source/drain layer, to define a space for receiving the gate stack. For example, this can be done by selective etching. In this case, the gate stack may be embedded into the recess.

Source/drain regions may be formed in the first source/drain layer and the second source/drain layer. For example, this can be done by doping the first source/drain layer and the second source/drain layer. For example, ion implantation or plasma doping etc. may be performed, or the first source/drain layer and the second source/drain layer may be doped in situ while being grown. In an advantageous example, a sacrificial gate may be formed in the recess of the periphery of the channel with respect to the periphery of the first source/drain layer and the second source/drain layer. Then, a dopant source layer may be formed on surfaces of the first source/drain layer and the second source/drain layer, and dopants may be driven by, for example, annealing, from the dopant source layer into the active region via the first source/drain layer and the second source/drain layer. The sacrificial gate may prevent the dopants from directly moving into the channel layers. However, some of the dopants may move into end portions of the respective channel layers close to the first source/drain layer and the second source/drain layer through the first source/drain layer and the second source/drain layer.

Here, the strained source/leakage technique can also be applied. Specifically, a strained or stressed material may be introduced into the second source/drain layer to create stress in the channel layer. For example, the second source/drain layer may be patterned to at least partially remove the second source/drain layer and then the stressed semiconductor material is grown with a remaining portion of the second source/drain layer (in a case that the second source/drain layer is not completely removed) or the channel layer (in a case that the second source/drain layer is completely removed) as a seed.

The technology of the present disclosure can be implemented in various ways, some of which are exemplified in the following with reference to the drawings.

FIGS. 1-20 are schematic views showing a flow of manufacturing a semiconductor device according to an embodiment of the present disclosure.

As shown in FIG. 1, a substrate 1001 is provided. The substrate 1001 may be a substrate in any form, for example, but not limited to, a bulk semiconductor substrate such as a bulk silicon (Si) substrate, a Semiconductor on Insulator (SOI) substrate, a compound semiconductor substrate such as a SiGe substrate, or the like. Hereinafter, the bulk Si substrate will be described by way of example for convenience of description.

On the substrate 1001, a channel layer 1003 and another semiconductor layer 1005 may be formed in sequence by, for example, epitaxy. As an example, the channel layer 1003 may comprise a semiconductor material such as SiGe (with an atomic percentage of Ge being about 10-40%) which is different from that of the substrate 1001 and the semiconductor layer 1005, with a thickness of about 10-100 nm; and the semiconductor layer 1005 may comprise a semiconductor material such as Si which is the same as that of the substrate 1001, with a thickness of about 20-50 nm. Of course, the present disclosure is not limited thereto. For example, the channel layer 1003 may comprise Si:C, Ge or a III-V group compound semiconductor material. Further, the channel layer 1003 may even comprise a semiconductor material having the same components as the substrate 1001 or the semiconductor layer 1005, but with different contents of the components (for example, they all comprise SiGe, but with different atomic percentages of Ge), as long as the channel layer 1003 has etching selectivity with respect to the underlying substrate 1001 and the overlying semiconductor layer 1005.

Figure 2A:
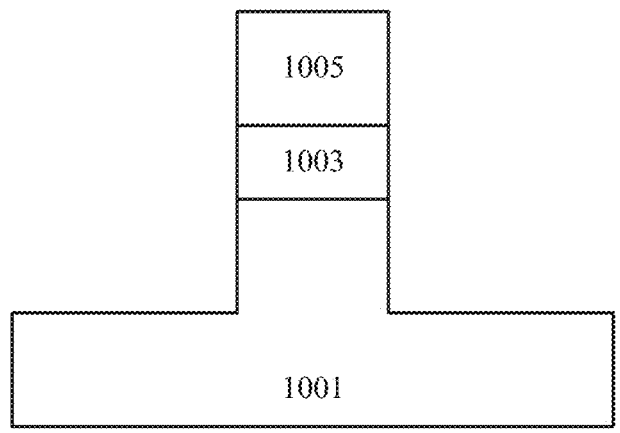
Figure 2B:
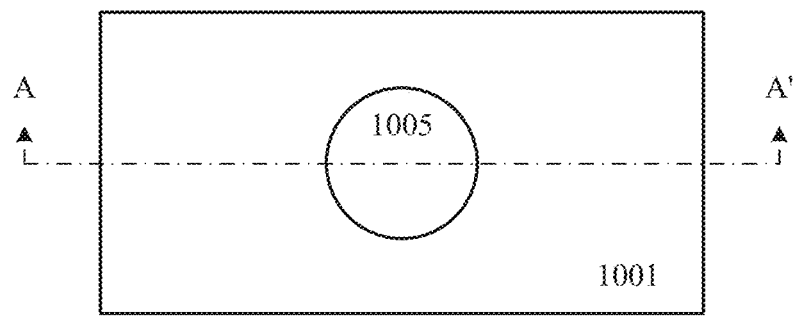

Next, an active region can be defined for the device. For example, this can be done as follows. Specifically, as shown in FIGS. 2(a) and 2(b) (FIG. 2(a) is a sectional view, and FIG. 2(b) is a top view with line AA' indicating the location where the sectional view is taken), photoresist (not shown) may be formed on a stack of the substrate 1001, the channel layer 1003 and the semiconductor layer 1005 shown in FIG. 1, and then patterned into a desired shape (a substantially circular shape in this example) by photolithography (exposing and developing). The semiconductor layer 1005, the channel layer 1003 and the substrate 1001 may be selectively etched by, for example, Reactive Ion Etching (RIE) in sequence with the patterned photoresist as a mask. The etching goes into the substrate 1001, but stops before reaching a bottom surface of the substrate 1001. Then, the semiconductor layer 1005, the channel layer 1003 and an upper portion of the substrate 1001 are in a pillar shape (a cylindrical shape in this case) after being etched. The RIE may be performed in, for example, a direction substantially perpendicular to a surface of the substrate, and thus the pillar shape extends in the direction substantially perpendicular to the substrate surface. After that, the photoresist may be removed.

Figure 3:
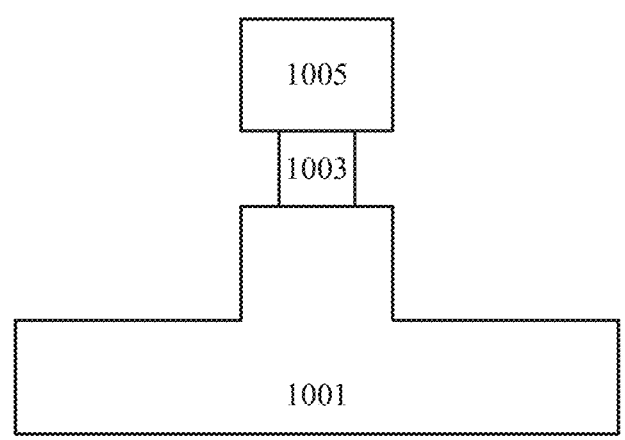

Then, as shown in FIG. 3, a periphery of the channel layer 1003 may be recessed (in this example, in a lateral direction substantially parallel to the substrate surface) with respect to that of the substrate 1001 and the semiconductor layer 1005. This may be achieved, for example, by further selectively etching the channel layer 1003 with respect to the substrate 1001 and the semiconductor layer 1005. For example, selective etching may be performed by Atomic Layer Etching (ALE) or digital etching. For example, surfaces of the substrate 1001, the channel layer 1003 and the semiconductor layer 1005 are oxidized by thermal treatment and respective surface oxide layers thereof are then removed. In a case that the channel layer 1003 is SiGe and the substrate 1001 and the semiconductor layer 1005 are Si, oxidation of SiGe is faster than that of Si, and the oxide on SiGe is easier to be removed. Those steps of oxidation and oxide removing can be repeated to achieve the desired recess. In this way, it is possible to well control the recess as compared to the conventional selective etching.

Thus, the active region of the semiconductor device is defined (i.e., the substrate 1001, especially an upper portion thereof, the channel layer 1003 and the semiconductor layer 1005, after being etched). In this example, the active region is substantially in a pillar shape. In the active region, the upper portion of the substrate 1001 may have its periphery substantially aligned with that of the semiconductor layer 1005, while the periphery of the channel layer 1003 is relatively recessed. Upper and lower sidewalls of the recess are defined by interfaces between the channel layer 1003 and the semiconductor layer 1005 and between the channel layer 1003 and the substrate 1001, respectively.

Certainly, the active region is not limited to the specific shape illustrated, but can be formed in different shapes according to design layout. For example, the active region may be in an ellipse, a square, a rectangle, or the like in the top view.

Figure 4:
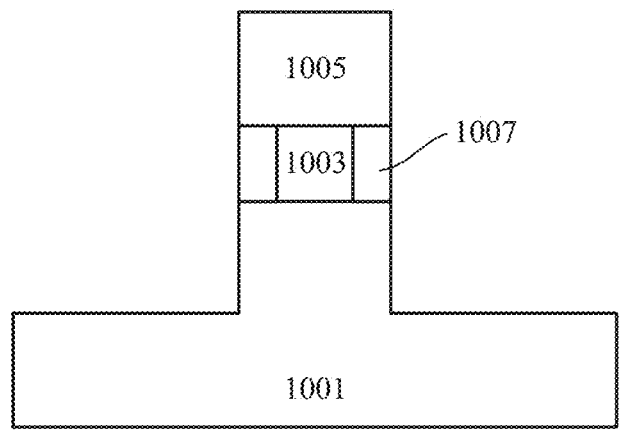

In the recess which is formed by the channel layer 1003 with respect to the periphery of the upper portion of the substrate 1001 and the semiconductor layer 1005, a gate stack will be formed later. To prevent the following process from impacting the channel layer 1003 or leaving some unwanted material(s) in this recess which will impede the formation of the gate stack, a material layer may be filled in the recess to occupy the space for the gate stack (and thus, this material layer may be referred to as a "sacrificial gate"). For example, this can be done by depositing nitride on the structure shown in FIG. 3 and then etching the deposited nitride back by, for example, RIE. The RIE may be performed in a direction substantially perpendicular to the substrate surface, so that the nitride can be left only within the recess, resulting in the sacrificial gate 1007, as shown in FIG. 4. In this case, the sacrificial gate 1007 may substantially fill the recess up.

Next, source/drain regions may be formed in the substrate 1001 and the semiconductor layer 1005. The source/drain regions may be formed by doping the substrate 1001 and the semiconductor layer 1005. For example, this may be done as follows.

Figure 5:
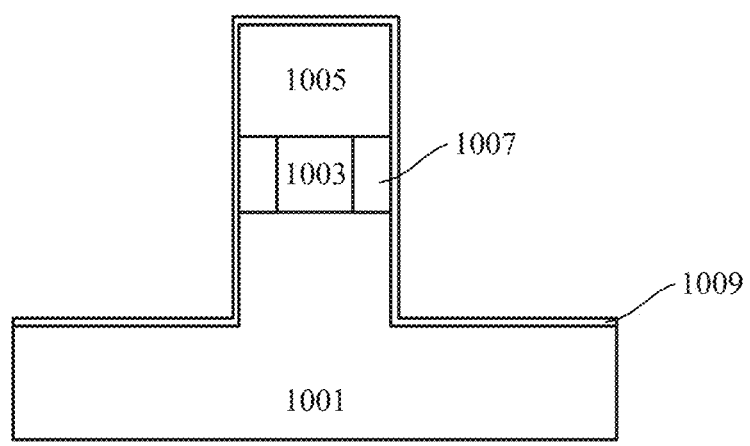

Specifically, as shown in FIG. 5, a dopant source layer 1009 may be formed on the structure shown in FIG. 4. For example, the dopant source layer 1009 may comprise oxide such as silicon oxide, containing dopants. For an n-type device, n-type dopants may be contained, and for a p-type device, p-type dopants may be contained. Here, the dopant source layer 1009 may be a thin film, so as to be deposited in a substantially conformal manner on a surface of the structure shown in FIG. 4 by, for example, Chemical Vapor Deposition (CVD) or Atom Layer Deposition (ALD) etc.

Figure 6:
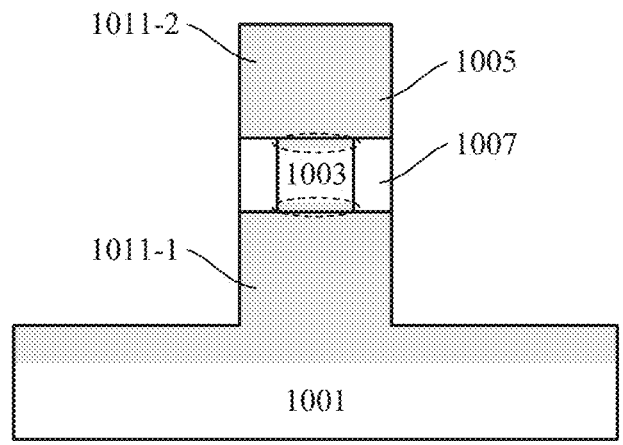

Next, as shown in FIG. 6, dopants included in the dopant source layer 1009 may be driven into the active region by, for example, annealing, so that doped regions are formed therein, as indicated by shadowed regions in the figure. More specifically, one of the source/drain regions 1011-1 may be formed in the substrate 1001 and the other 1011-2 may be formed in the semiconductor layer 1005. After that, the dopant source layer 1009 may be removed.

Further, in spite of the sacrificial gate 1007, the dopants may also go into the channel layer 1003 via the substrate 1001 and the semiconductor layer 1005, so that the channel layer 1003 may have its top and bottom ends with some doping distribution, as indicated by dashed ellipse in the figure. Such doping distribution helps to reduce the resistance between the source/drain regions when the device is ON, resulting in improved device performances.

In the above example, the source/drain regions are formed by driving the dopants from the dopant source layer to the active region. However, the present disclosure is not limited thereto. For example, the source/drain regions may be formed by ion implantation, plasma doping (for example, conformal doping along a surface of the structure in FIG. 4) etc. Alternatively, in the process described above in connection with FIG. 1, a well region may be formed in the substrate 1001, then the channel layer 1003 may be grown thereon, and then the semiconductor layer 1005 may be grown on the channel layer 1003 and doped in-situ. When the channel layer 1003 is grown, it may also be doped in-situ to adjust a threshold voltage (Vt) of the device.

In this example, the dopant source layer 1009 includes a portion extending along a horizontal surface of the substrate 1001 so that the doped region formed in the substrate 1001 extends beyond the periphery of the pillar shaped active region. In this way, it is relatively easy to make electrical connection to the source/drain region 1011-1 through the doped region in subsequent processes.

In addition, in order to reduce the contact resistance, silicidation may be performed on the source/drain layers. For example, a layer of NiPt (for example, with a Pt content of about 2-10%, a thickness of about 2-10 nm) may be deposited on the structure shown in FIG. 6, and annealing may be performed at a temperature of about 200-400° C., so that NiPt reacts with Si to produce SiNiPt. After that, unreacted remaining NiPt may be removed.

Figure 7:
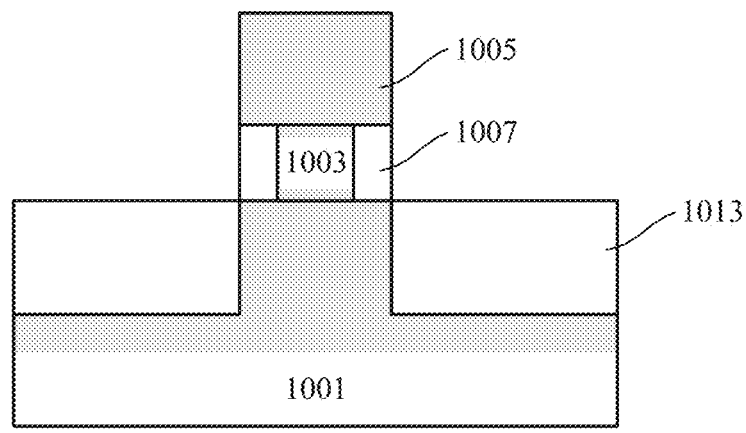

An isolation layer may be formed around the active region to realize electrical isolation. For example, as shown in FIG. 7, oxide may be deposited on the structure shown in FIG. 6 and then etched back to form an isolation layer 1013. Before the back etching, the deposited oxide may be planarized by, for example, Chemical Mechanical Polishing (CMP) or sputtering. Here, the isolation layer 1013 may have its top surface close to an interface between the channel layer 1003 and the substrate 1001.

When the isolation layer is being formed, the sacrificial gate 1007 may remain to prevent the material of the isolation layer from going to the recess in which the gate stack is to be accommodated. After that, the sacrificial gate 1007 may be removed to release the space in the recess. For example, the sacrificial gate 1007 (nitride) may be selectively etched with respect to the isolation layer 1013 (oxide), the semiconductor layer 1005 (Si) and the channel layer 1003 (SiGe).

Figure 8:
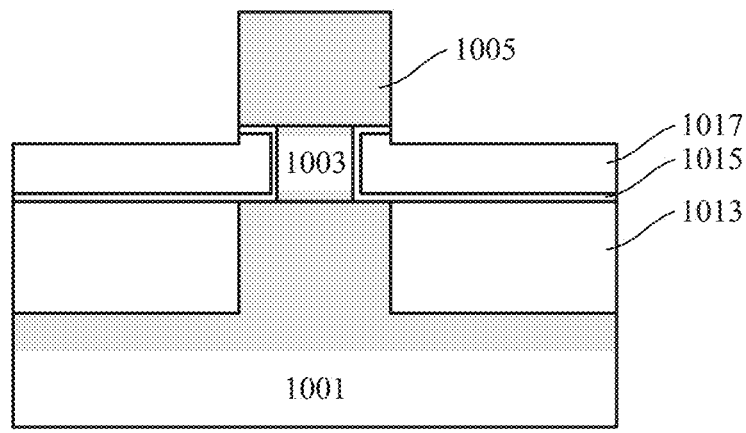

Then, as shown in FIG. 8, a gate stack may be formed in the recess. Specifically, a gate dielectric layer 1015 and a gate conductor layer 1017 may be deposited in sequence on the structure shown in FIG. 7 (with the sacrifice gate 1007 removed), and the deposited gate conductor layer 1017 (and optionally the gate dielectric layer 1015) may be etched back so that a portion thereof outside the recess has its top surface at a level not higher and preferably lower than the top surface of the channel layer 1003. For example, the gate dielectric layer 1015 may include high K gate dielectric such as $HfO_2$; and the gate conductor layer 1017 may include a metal gate conductor. Further, a work function adjustment layer may further be formed between the gate dielectric layer 1015 and the gate conductor layer 1017. An interfacial layer of, for example, oxide, may be formed before the formation of the gate dielectric layer 1015.

In this way, the gate stack may be embedded into the recess, and thus overlap with an entire height of the channel layer 1003.

In addition, depending on a position of the top surface of the isolation layer 1013, the gate stack may overlap with the underlying source/drain region 1011-1 (for example, in a case that the isolation layer 1013 has its top surface lower that the interface between the channel layer 1003 and the substrate 1001), which may increase parasitic capacitance between the gate and the source/drain. Therefore, it is preferable that the isolation layer 1013 has its top surface not lower than the interface between the channel layer 1003 and the substrate 1001.

Figure 9:
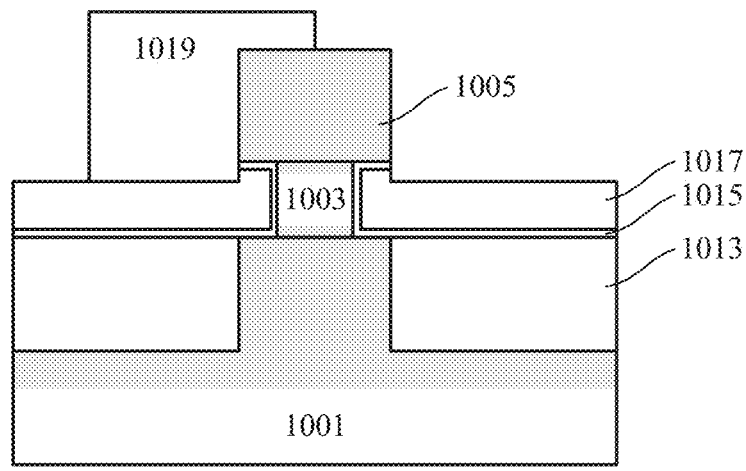

Next, the gate stack may be adjusted in shape to facilitate manufacturing of contacts later. For example, as shown in FIG. 9, photoresist 1019 may be formed on the structure shown in FIG. 8. The photoresist 1019 is patterned, for example, by photolithography to cover one portion (in this example, the left portion in the figure, which may be a strip extending outwards in a certain direction from the periphery of the active region) of the gate stack outside the recess while exposing another portion (in this example, the right half in the figure) of the gate stack outside the recess.

Figure 10:
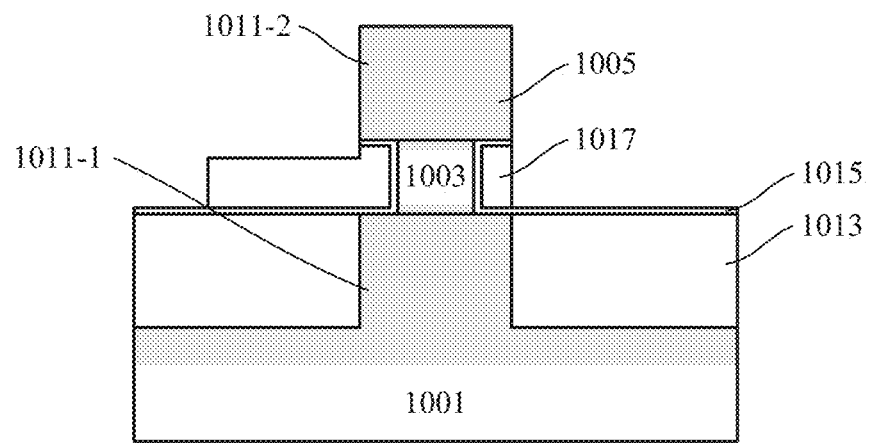

Then, as shown in FIG. 10, the gate conductor layer 1017 may be selectively etched by, for example, RIE with the photoresist 1019 as a mask. In this way, in addition to a portion of the gate conductor layer 1017 which remains in the recess, the portion of the gate conductor layer 1017 which is covered by the photoresist 1019 is left. Later, an electrical connection to the gate stack may be achieved by this portion. After that, the photoresist 1019 may be removed.

So far, manufacturing of the device has almost completed. As shown in FIG. 10, the semiconductor device according to this embodiment includes the substrate 1001, the channel layer 1003 and the semiconductor layer 1005 stacked vertically. the source/drain region 1011-1 is formed in the substrate 1001, and the source/drain region 1011-2 is formed in the semiconductor layer 1005. The channel layer 1003 is laterally recessed and the gate stack (1015/1017) is formed around the periphery of the channel layer 1003 and embedded in the recess.

In addition, in the semiconductor device, the strained source/drain technique can be applied. For example, a stressed semiconductor material may be incorporated into the semiconductor layer 1005 on the upper side.

A liner may be formed on surfaces of the substrate 1001 and the semiconductor layer 1005 in order to protect the active region and accurately stop etching in subsequent processes.

Figure 11A:
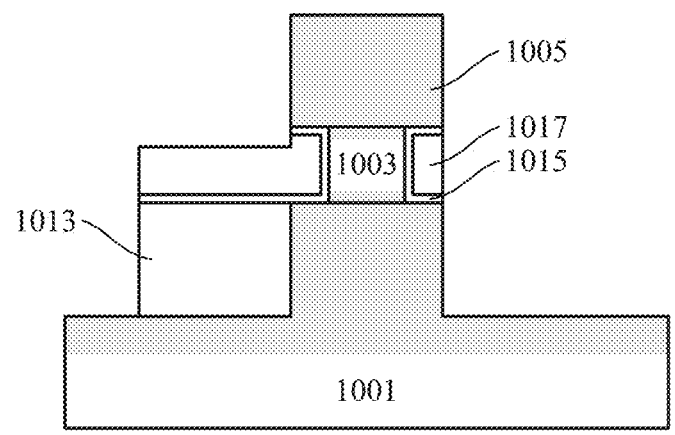
Figure 11B:
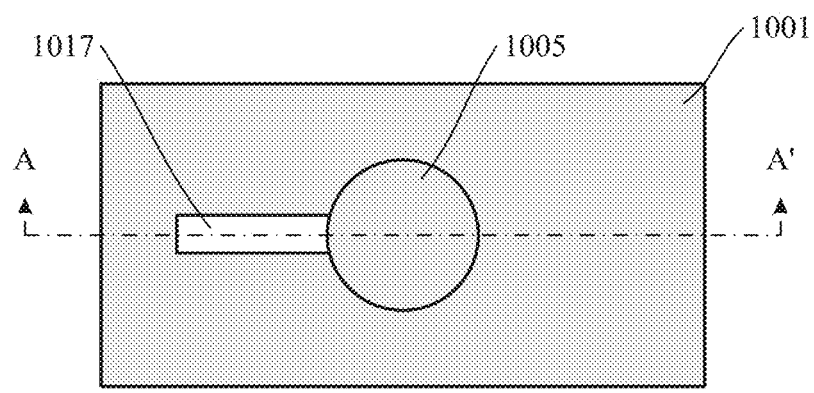

To do this, further processes may be performed to expose the surfaces of the substrate 1001 and the semiconductor layer 1005 (the surface of the semiconductor layer 1005 has already been exposed), in particular an upper surface on which a contact is to be formed. As shown in FIGS. 11(*a*) and 11(*b*) (FIG. 11(*a*) is a sectional view, and FIG. 11(*b*) is a top view with line AA' indicating the location where the sectional view is taken), the gate dielectric layer 1015 and the isolation layer 1013 may be selectively etched by, for example, RIE. The RIE may be performed in a direction substantially perpendicular to the substrate surface. Thus, the upper surface of the substrate 1001, except for the portion remaining below the gate stack and the channel layer, is exposed.

Then, a liner 1201 may be formed on the structure shown in FIGS. 11(*a*) and 11(*b*). For example, the liner 1201 may be formed by depositing a nitride layer in a substantially conformal manner. The liner 1201 may have a thickness of about 10-50 nm. As shown, the liner 1201 may cover the upper surfaces of the semiconductor layer 1005 and the substrate 1001, to protect the active region and also act as an etching stopper layer later.

In addition, the liner 1201 may be stressed. For example, for an n-type device, the liner 1201 may be compressive stressed to create tensile stress in the channel layer; and for ap-type device, the liner 1201 may be tensile stressed to create compressive stress in the channel layer.

Figure 12:
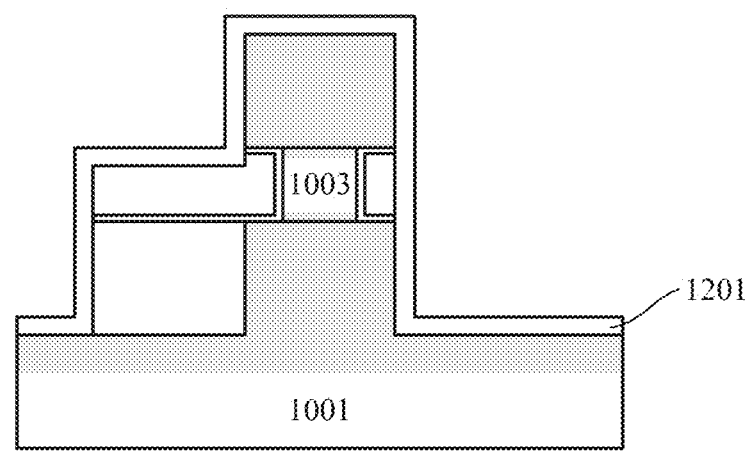
Figure 13:
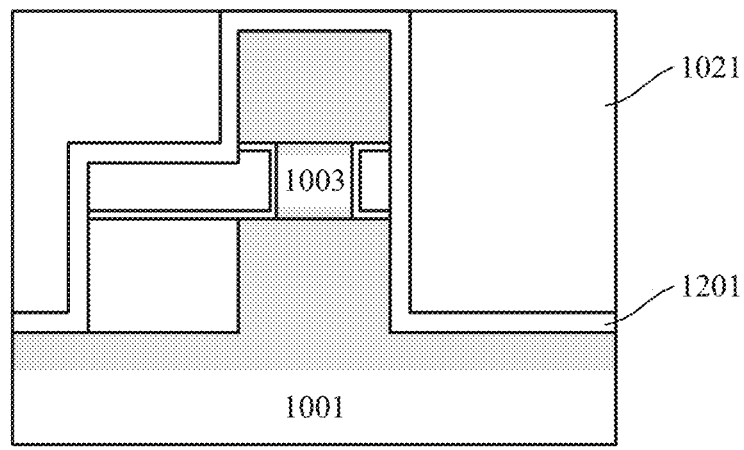

Then, as shown in FIG. 13, an interlayer dielectric layer 1021 may be formed on the structure shown in FIG. 12. For example, the interlayer dielectric layer 1021 may be formed by depositing oxide and then planarizing it by, for example, CMP. The CMP may be stopped at the liner 1201.

Figure 14:
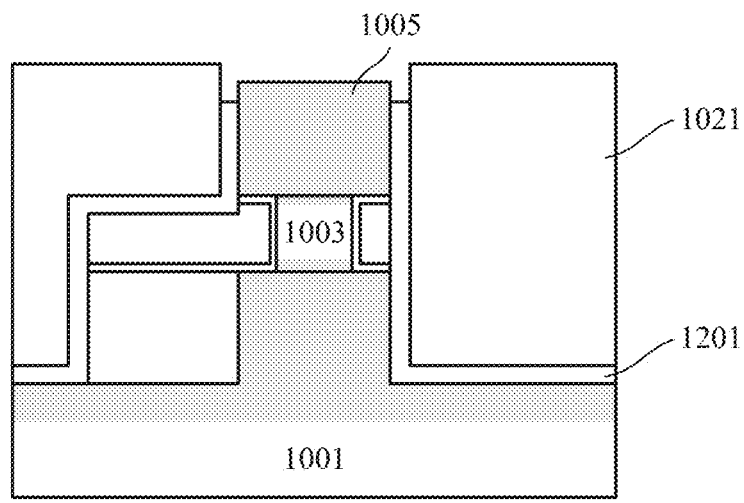

Next, the strained source/drain process may be performed. For example, as shown in FIG. 14, the liner 1201 may be patterned to at least partially expose the top surface of the semiconductor layer 1005. Here, the liner 1201 may be selectively etched by, for example, RIE. The RIE may be carried out, for example, in a direction substantially perpendicular to the substrate surface. Thus, the liner 1201 may have its portion on the top surface of the semiconductor layer 1005 removed, and perhaps also have top ends of vertical portions thereof partially removed. Thus, an opening is left in the interlayer dielectric layer 1021 (and the liner 1201) through which the semiconductor layer 1005 is exposed.

Figure 15:
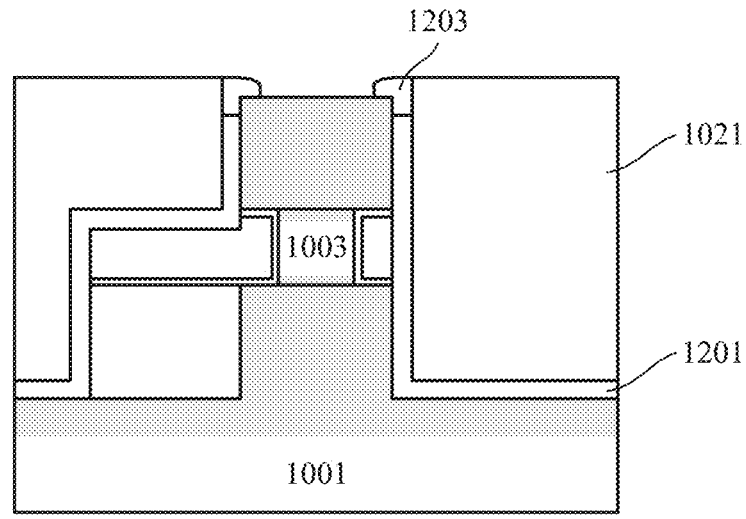

Then, as shown in FIG. 15, a spacer 1203 may be formed on sidewalls of the opening formed in the interlayer dielectric layer 1021 as described above. For example, the spacer 1203 may include nitride and has a width (a dimension in the horizontal direction in this figure) which may substantially cover sidewall portions of the semiconductor layer 1005 (but not completely cover the top surface of the semiconductor layer 1005). Those skilled in the art will recognize a variety of ways to form the spacer. For example, a nitride layer may be deposited in a substantially conformal manner on the structure shown in FIG. 14 and the deposited nitride is etched by, for example, RIE in a direction substantially perpendicular to the substrate surface to remove its horizontal extending portion, while leaving its vertical extending portion (on the sidewalls of the opening) to obtain the spacer. The width of the spacer 1203 is substantially determined by a thickness of the deposited nitride.

Figure 16:
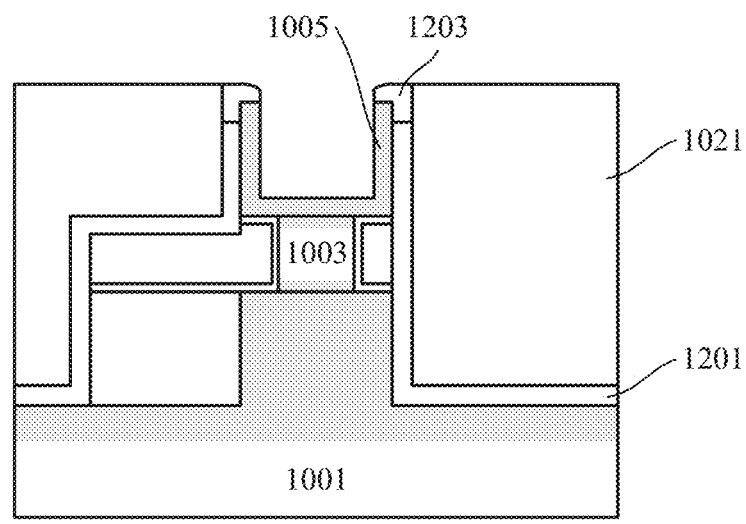

Next, as shown in FIG. 16, the semiconductor layer 1005 may be selectively etched with the formed spacer 1203 as a mask. Here, RIE or ALE may be used. The etching does not go to the bottom surface of the semiconductor layer 1005, but a portion of the semiconductor layer 1005 is left at the bottom. The sidewall portions of the semiconductor layer 1005 is also left due to the presence of the spacer 1203. Thus, the semiconductor layer 1005 has a "U" shape.

Figure 17:
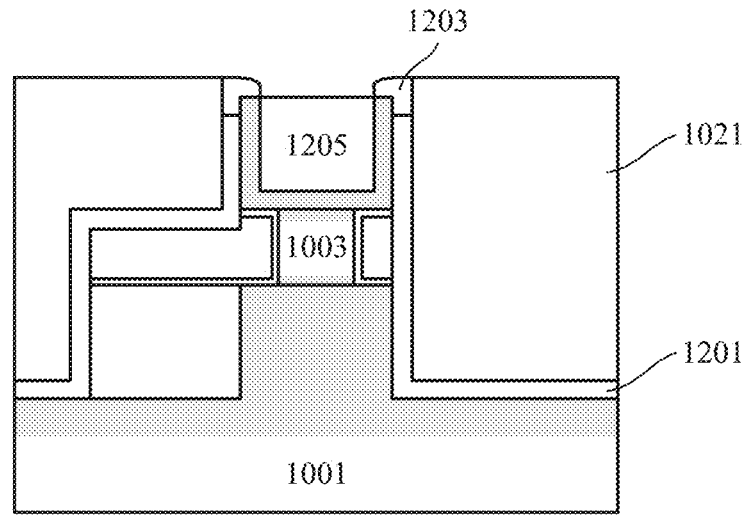

Then, as shown in FIG. 17, a stressed semiconductor material 1205 may be the grown epitaxially with the remaining portion of the semiconductor layer 1005 as a seed. Since the semiconductor layer 1005 has a "U" shape, epitaxy may be performed on the bottom portion and the sidewall portions of the semiconductor layer 1005, thereby facilitating the formation of a high quality epitaxial layer. The interlayer dielectric layer 1021 and the liner 1201 have a stress hold or enhancing function, and may be referred to as a stress enhancement layer. When the stressed semiconductor material 1205 is grown epitaxially, the stress enhancement layer limits free movement of the remaining portion of the semiconductor layer 1005 or the seed, thereby increasing the stress applied to the channel. The stress enhancement layer may have stress opposite to that of the stressed semiconductor material.

The semiconductor material 1205 may create compressive stress in the channel layer for a p-type device, and create tensile stress in the channel layer for an n-type device. For example, in this example (the channel layer is SiGe and the semiconductor layer 1005 is Si), the semiconductor material 1205 may include SiGe for the p-type device, and may include Si:C for the n-type device. Of course, the semiconductor material 1205 is not limited thereto, and may include other semiconductor materials such as GeSn or a III-V group compound semiconductor material having a lattice constant different from that of the second source/drain layer 1005. In addition, the semiconductor material 1205 may be doped in situ while being grown, by p-type doping (at a doping concentration of, for example, about 1E18-2E20 $cm^{-3}$) for the p-type device, or by n-type doping (at a doping concentration of, for example, about 1E18-1E21 $cm^{-3}$) for the n-type device.

Due to the strained source/drain technique, stress is created in the channel, thereby further improving the device performances.

Figure 18:
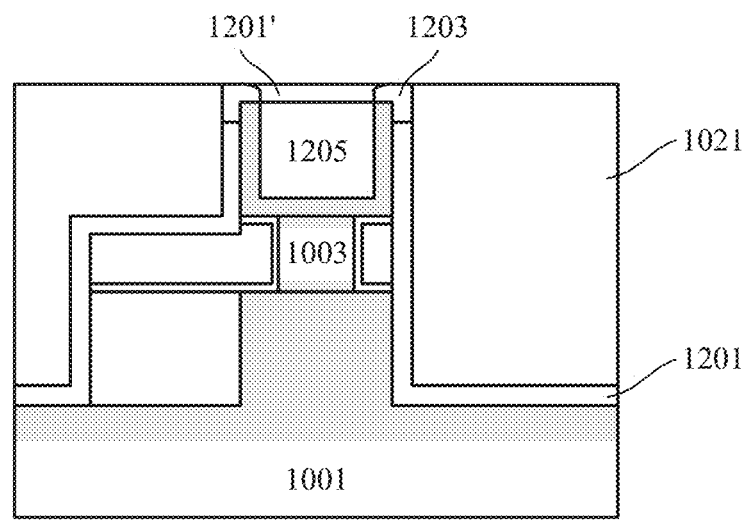

As described above, in order to apply the strained source/drain technique, the opening is formed in the liner 1201. The liner 1201 may be complemented for the purpose of protecting the active region and acting as the etching stopper layer. As shown in FIG. 18, a liner complementation portion 1201' may be formed in the opening. For example, nitride may be deposited on the structure shown in FIG. 17 and may be planarized by, for example, CMP, and the CMP may be stopped at the interlayer dielectric layer 1021. In this way, the nitride is filled in the opening to form the liner complementation portion 1201'.

Next, various contacts may be formed in the interlayer dielectric layer 1021.

Figure 19:
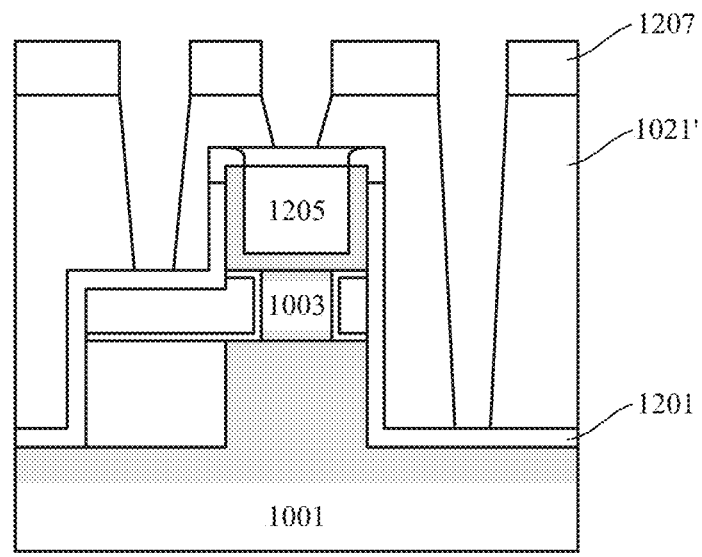

Specifically, as shown in FIG. 19, the interlayer dielectric layer 1021 may be thickened. For example, oxide may be further deposited on the interlayer dielectric layer 1021, and the deposited oxide may be planarized by, for example, CMP to thicken the interlayer dielectric layer. The thickened interlayer dielectric layer is denoted as "1201" in the figure. Photoresist 1207 may then be formed on the interlayer dielectric layer 1021', and the photoresist 1207 may be patterned by photolithography to expose a portion where contact holes are to be formed. After that, the interlayer dielectric layer 1021' is selectively etched by, for example, RIE with the patterned photoresist 1207 as a mask. Here, the RIE may be stopped at the liner 1201.

Since the thicknesses of the interlayer dielectric layer 1021' above the source/drain region 1011-1, the source/drain region 1011-2, and the gate conductor layer 1017 are different, it is difficult to etch the contact holes. In this embodiment, it is relatively easy to stop the etching of the contact holes due to the presence of the liner 1201.

Figure 20:
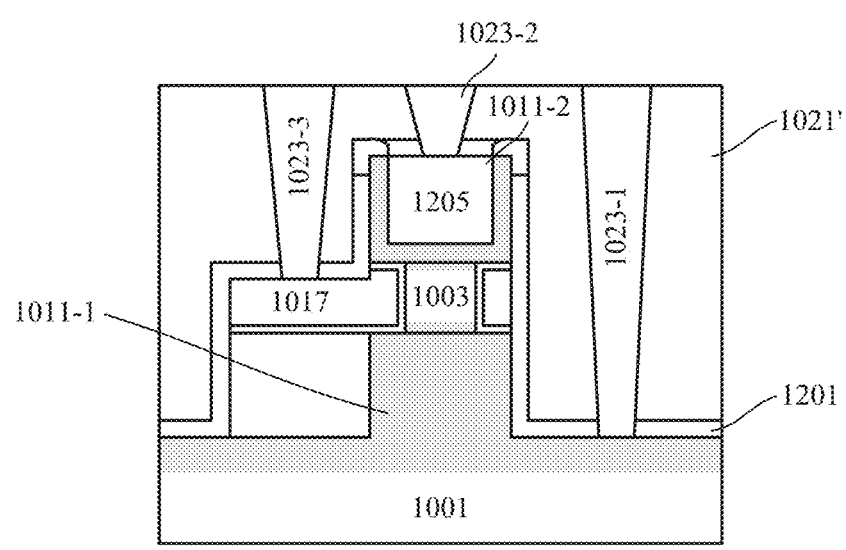

Then, as shown in FIG. 20, the liner 1201 may be further etched by, for example, RIE. Here, the RIE may be stopped at the substrate 1001 and the semiconductor layer 1205 of the semiconductor materials. Since the liner 1201 may have a substantially uniform thickness, it is relatively easy to control the etching of the liner 1201.

In the contact holes which are thus formed, a conductive material such as a metal (for example, W) or the like may be filled to form a contact 1023-1 to the source/drain region 1011-1, a contact 1023-2 to the source/drain region 1011-2, and a contact 1023-3 to the gate conductor layer 1017. Before filling the metal, a barrier layer of, for example, TiN may be formed on inner walls of the contact holes.

Since the gate conductor layer 1017 extends beyond the periphery of the active region, it is relatively easy to form the contact 1023-3 thereto. In addition, since the doped region in the substrate 1001 extends beyond the active region and has at least some portion thereof not covered by the gate conductor layer, it is relatively easy to form the contact 1023-1 thereto.

Figure 21:
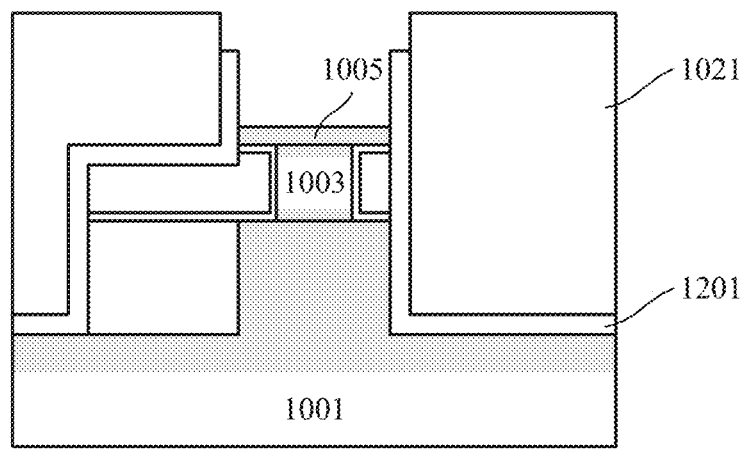
FIGS. 21 and 22 are schematic views showing some stages in a flow of manufacturing a semiconductor device according to another embodiment of the present disclosure.
Figure 22:
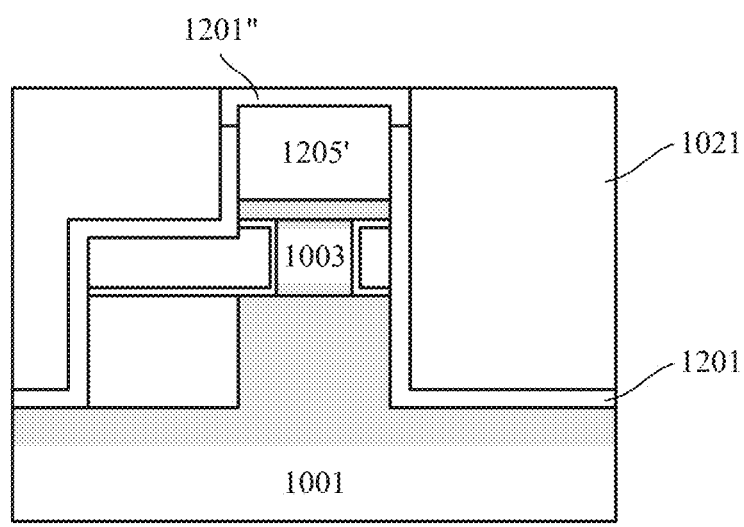

FIGS. 21 and 22 are schematic views showing some stages in a flow of manufacturing a semiconductor device according to another embodiment of the present disclosure. Hereinafter, descriptions focus on differences between the present embodiment and the above-described embodiments.

In the above-described embodiment, when the semiconductor layer 1005 is etched, the spacer 1203 is used as a mask. In contrast, in the present embodiment, the spacer 1203 may not be formed. For example, the exposed semiconductor layer 1005 may be selectively etched directly after the opening is formed in the interlayer dielectric layer 1021 and the liner 1201 as described above in connection with FIG. 14. Likewise, the etching may not go to the bottom surface of the semiconductor layer 1005, but a portion of the semiconductor layer 1005 is left at the bottom, as shown in FIG. 21. Here, since there is no spacer 1203, the remaining portion of the semiconductor layer 1005 does not have a vertical extending portion, but is substantially planar.

Then, as shown in FIG. 22, a stressed semiconductor layer 1205' may be grown epitaxially with the remaining portion of the semiconductor layer 1005 as a seed. Further, a liner complementation portion 1201" may be formed to complement the liner 1201. For this, reference may be made to the detailed descriptions in conjunction with FIGS. 16 and 18, and detailed descriptions thereof will be omitted here.

Of course, the semiconductor layer 1005 may also be completely etched away. For example, the etching of the semiconductor layer 1005 may be stopped at the channel layer 1003. Next, the stressed semiconductor layer 1205' may be grown with the channel layer 1003 as a seed layer.

Then, the contacts may be made likewise.

FIGS. 23-31 are schematic views showing some stages in a flow of manufacturing a semiconductor device according to another embodiment of the present disclosure. Hereinafter, descriptions focus on differences between the present embodiment and the above-described embodiments.

Figure 23:
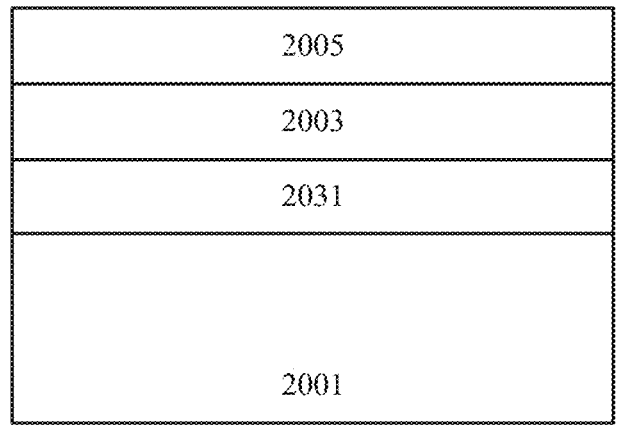
FIGS. 23-31 are schematic views showing some stages in a flow of manufacturing a semiconductor device according to another embodiment of the present disclosure.

As shown in FIG. 23, a substrate 2001 is provided. With respect to the substrate, reference may be made to the above description in conjunction with FIG. 1. Here, also a bulk Si substrate is described by way of example.

A first source/drain layer 2031, a channel layer 2003, and a second source/drain layer 2005 may be formed in sequence on the substrate 2001 by, for example, epitaxy. For example, the first source/drain layer 2031 may include $Si_{1-x}Ge_x$ (with an atomic percentage of Ge being about 10-40%), with a thickness of about 20-50 nm; the channel layer 2003 may include Si, with a thickness of about 10-100 nm; and the second source/drain layer 2005 may include $Si_{1-x}Ge_x$ (with an atomic percentage of Ge being about 10-40%), with a thickness of about 20-50 nm. A lattice constant of $Si_{1-x}Ge_x$ without being strained is greater than that of Si without being strained. The materials for the first source/drain layer 2031, the channel layer 2003, and the second source/drain layer 2005 are not limited thereto. Other semiconductor materials are also possible as long as they can provide appropriate etching selectivity. As an example, the first source/drain layer 2031 and the second source/drain layer 2005 may comprise Si:C (with an atomic percentage of C being about 0.1-5%), with a thickness of about 20-50 nm, while the channel layer 2003 may comprise Si, with a thickness of about 10-100 nm. Si:C has a smaller lattice constant than Si, without being strained.

The first source/drain layer 2031 and the second source/drain layer 2005 may be doped in situ while being grown. For example, for an n-type device, n-type doping may be performed on the first source/drain layer 2031 and the second source/drain layer 2005; and for a p-type device, p-type doping may be performed on the first source/drain layer 2031 and the second source/drain layer 2005. In addition, the channel layer 2003 may also be doped in situ to adjust a threshold voltage (Vt) of the device. For example, for the n-type device, p-type doping may be performed on the channel layer 2003; and for the p-type device, n-type doping may be performed on the channel layer 2003. In addition, for a junctionless device, the same type of doping may be performed on the first source/drain layer 2031, the channel layer 2003, and the second source/drain layer 2005. Especially in a case that the source/drain layer is Si:C and the channel layer is Si, the in situ doping facilitates selective etching in subsequent processes. For example, a doping concentration (for example, for n-type dopants) in the first source/drain layer 2031 and the second source/drain layer 2005 of Si:C may be about 1E19-1E21 $cm^{-3}$, and a doping concentration (for example, for p-type dopants) in the channel layer 2003 of Si may be about 1E17-1E19 $cm^{-3}$.

Doping of the respective layers is not limited to in situ doping. For example, doping may be performed by ion implantation or vapor phase drive-in, etc. after the growth.

Figure 24:
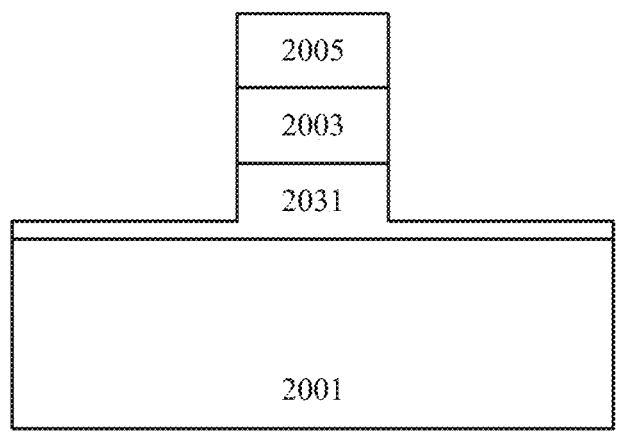

Next, an active region of the device may be defined. As shown in FIG. 24, the second source/drain layer 2005, the channel layer 2003, and the first source/drain layer 2031 may be selectively etched by, for example, RIE in sequence. For this, reference may be made to the above description in conjunction with FIGS. 2(a) and 2(b). For a p-type device, because $Si_{1-x}Ge_x$ without being strained has a greater lattice constant than Si without being strained, Si is strained after the RIE. The strain will cause the mobility of holes in Si become greater than that if without the strain, or cause the effective mass of light holes in Si become smaller than that if without the strain, or cause the concentration of light holes in Si become greater than that if without the strain, so that the p-type device will have an increased ON current and thus has its performances improved. Alternatively, for an n-type device, because Si:C without being strained has a smaller lattice constant than Si without being strained, Si is strained after the RIE. The strain will cause the mobility of electrons in Si become greater than that if without the strain, or cause the effective mass of electrons in Si become smaller than that if without the strain, so that the n-type device will have an increased ON current and thus has its performances improved.

Further, if SiGe is selected to be used as the material for the channel layer and Si is selected to be used as the material for the source/drain layers, this selection will result in an increased ON current and a reduced OFF current for the p-type device, so that the p-type device's performances are improved. This is because Si has a forbidden band gap greater than that of SiGe, and the mobility of holes in SiGe is higher than that in Si.

In this example, the etching may go to the first source/drain layer 2031, but does not go to the bottom surface of the first source/drain layer 2031. However, the present disclosure is not limited thereto, and the etching of the first source/drain layer 2031 may also go to the bottom surface of the first source/drain layer 2031.

Figure 25:
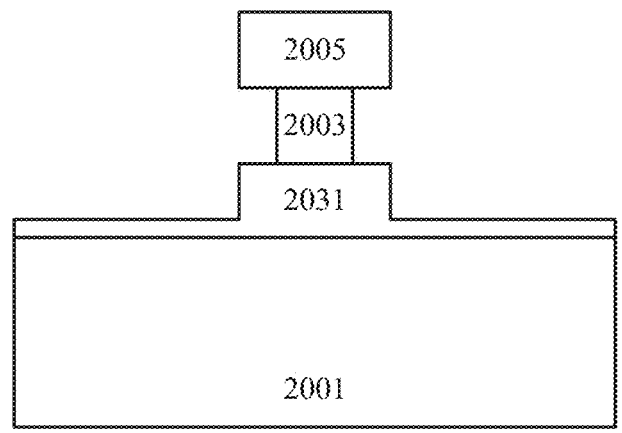
Figure 26:
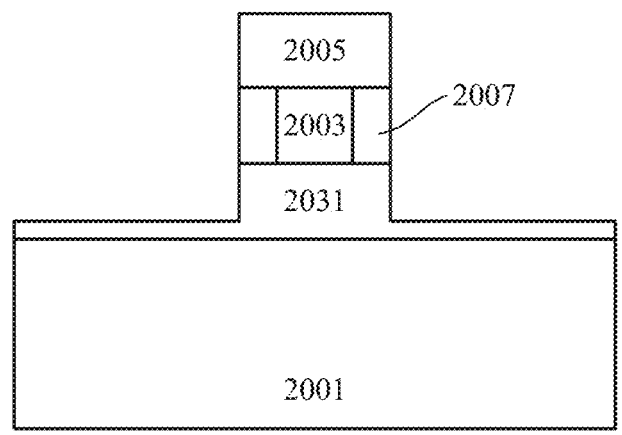

Then, as shown in FIG. 25, the periphery of the channel layer 2003 may be recessed with respect to that of the first source/drain layer 2031 and the second source/drain layer 2005. As described above, this can be achieved by selective etching (such as wet etching using TMAH solution) or digital etching etc. For this, reference may be made to the above description in conjunction with FIG. 3. Upper and lower sidewalls of the recess are defined by interfaces between the channel layer 2003 and the second source/drain layer 2005 and between the channel layer and the first source/drain layer 2031, respectively. Likewise, a sacrificial gate 2007 may be formed in the recess of the channel layer 2003 with respect to the first source/drain layer 2031 and the second source/drain layer 2005, as shown in FIG. 26.

Figure 27:
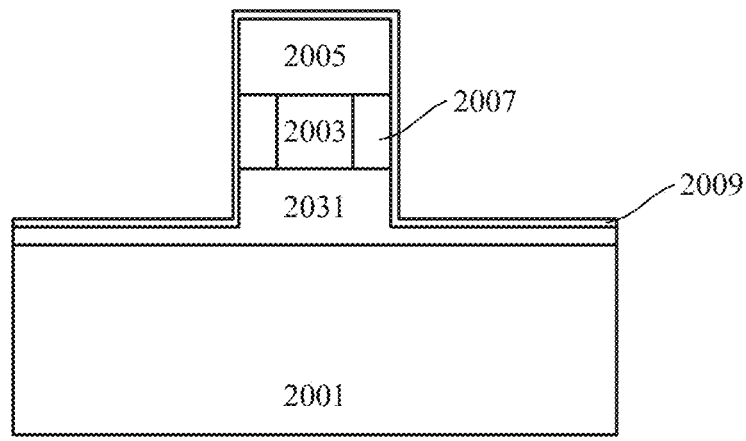
Figure 28:
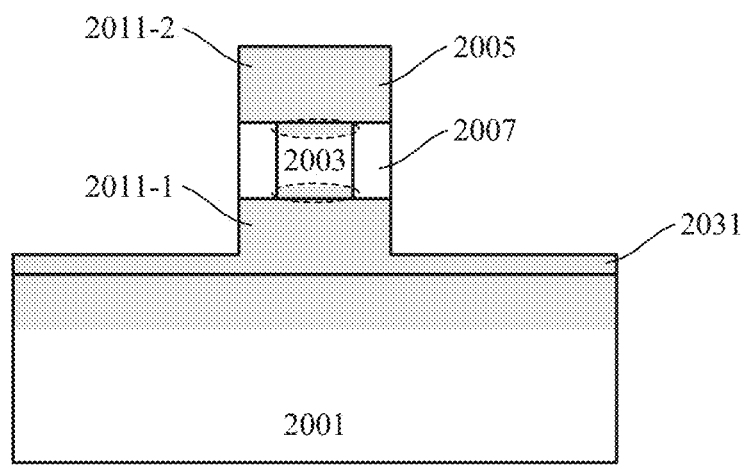

Next, source/drain regions may be formed in the first source/drain layer 2031 and the second source/drain layer 2005. This can be done according to the above process. For example, as shown in FIG. 27, a dopant source layer 2009 may be formed on the structure shown in FIG. 26. Next, as shown in FIG. 28, dopants included in the dopant source layer 2009 may be driven into the active region by, for example, annealing, so that doped region is formed therein, as indicated by shadowed regions in the figure. More specifically, one source/drain region 2011-1 may be formed in the first source/drain layer 2031 and another source/drain region 2011-2 may be formed in the second source/drain layer 2005. After that, the dopant source layer 2009 may be removed. For this, reference can be made to the above description in conjunction with FIGS. 4-6.

Similarly, the dopants may also go into the channel layer 2003 via the first source/drain layer 2031 and the second source/drain layer 2005, so that the channel layer 2003 may have its top and bottom ends with some doping distribution, as indicated by dashed ellipses in the figure.

Of course, since the first source/drain layer 2031 and the second source/drain layer 2005 have been doped at the time of growth as described above, the steps of forming the dopant source layer and driving dopants from the dopant source layer into the source/drain layer may be omitted. Nevertheless, the annealing process may also be performed so that the dopants in the first source/drain layer 2031 and the second source/drain layer 2005 go into the channel layer 2003, to form some doping distribution in the top and bottom ends of the channel layer 2003.

Figure 29:
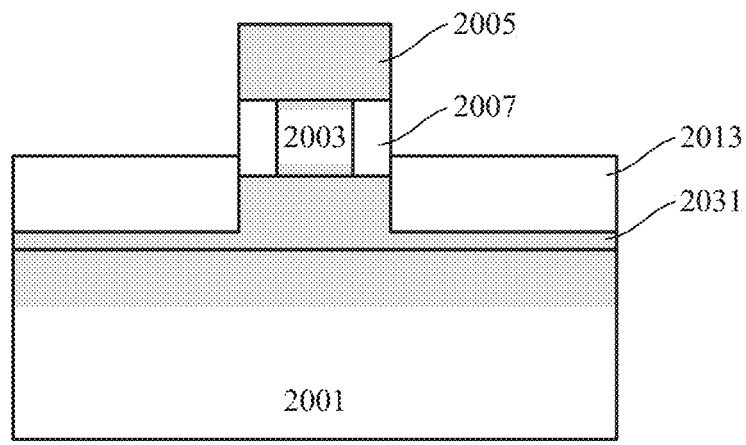

An isolation layer may be formed around the active region to realize electrical isolation. For example, as shown in FIG. 29, the isolation layer 2013 may be formed on the structure shown in FIG. 28. Here, the isolation layer 2013 may has its top surface at a level between a top surface and a bottom surface of the channel layer 2003, which facilitates formation of a self-aligned gate stack. Then, the sacrificial gate 2007 may be removed to release the space in the recess. For details of the isolation layer, reference may be made to the above description in conjunction with FIG. 7.

Figure 30:
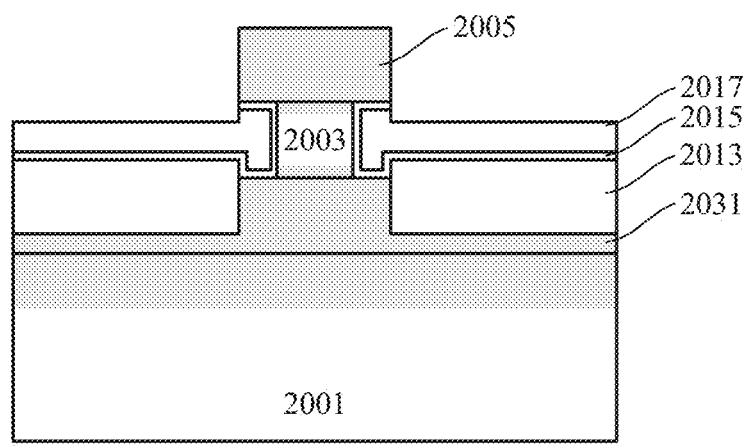

Then, as shown in FIG. 30, a gate stack may be formed in the recess. Specifically, the gate stack includes a gate dielectric layer 2015 and a gate conductor layer 2017. For this, reference may be made to the above description in conjunction with FIG. 8. Due to the arrangement of the top surface of the isolation layer 2013, the gate stack overlaps with only a side surface of the channel layer 2003 in the vertical direction, and does not overlap with respective side faces of the first source/drain layer and the second source/drain layer in the vertical direction. That is, the gate stack is self-aligned with the channel layer 2003.

Then, shape adjustment of the gate stack, formation of a liner 2201, formation of strained source/drain, and formation of contacts etc. may be performed in the same manner as described above, for example, as described above in connection with FIGS. 9-20. Thus, as shown in FIG. 31, a stressed semiconductor layer 2205 is introduced into the second source/drain layer 2005, and a contact 2023-1 to the source/drain region 2011-1, a contact 2023-2 to the source/drain region 2011-2, and a contact 2023-3 to the gate conductor layer 2017 are formed in the interlayer dielectric layer 2021.

Similarly, the semiconductor material 2205 may create compressive stress in the channel layer for a p-type device, and create tensile stress in the channel layer for an n-type device. For example, in a case of the p-type device, the semiconductor material 2205 may include $Si_{1-y}Ge_y$ (y>x); and in a case of the n-type device, the semiconductor material 2205 may include $Si_{1-y}Ge_y$ (y<x) or Si:C.

Figure 32:
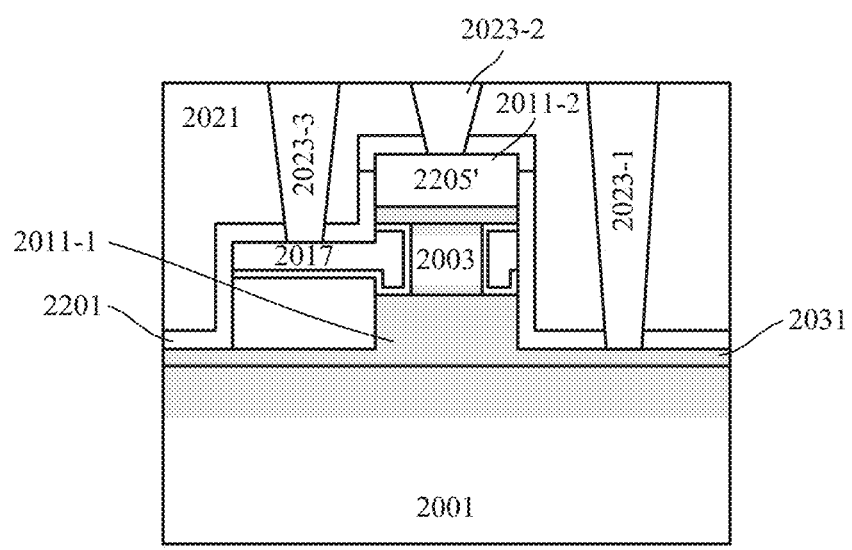
FIG. 32 is a cross-sectional view showing a semiconductor device according to another embodiment of the present disclosure.

FIG. 32 is a cross-sectional view showing a semiconductor device according to another embodiment of the present disclosure.

Figure 31:
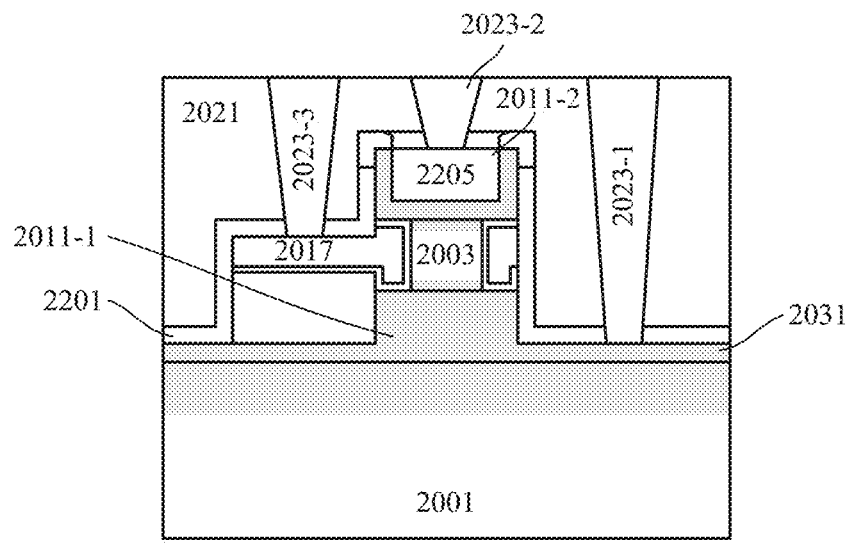

The semiconductor device shown in FIG. 32 is substantially the same as the semiconductor device shown in FIG. 31 except that the remaining portion of the second source/drain layer 2005 is substantially planar. This is because in this embodiment, when the second source/drain layer 2005 is patterned, the method described above in connection with FIGS. 21 and 22 is used, that is, no spacer is formed on the sidewalls of the opening of the interlayer dielectric layer 2021.

The semiconductor device according to the embodiments of the present disclosure is applicable to various electronic devices. For example, an Integrated Circuit (IC) may be formed by integrating a plurality of such semiconductor devices and also other devices (for example, transistors in other forms or the like), from which an electronic device may be made. Therefore, the present disclosure further provides an electronic device comprising the above semiconductor device. The electronic device may also comprise components such as a display operatively coupled to the IC and a wireless transceiver operatively coupled to the IC, or the like. Such an electronic device may comprise, for example, a smart phone, a computer, a tablet Personal Computer (PC), an artificial intelligence device, a wearable device, a mobile power supply, or the like.

According to an embodiment of the present disclosure, there is also provided a method of manufacturing a System on Chip (SoC). The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A method of manufacturing a semiconductor device, comprising:
   disposing a stack of a first source/drain layer, a channel layer and a second source/drain layer on a substrate;
   causing a periphery of the channel layer recessed inwards with respect to that of the first source/drain layer and the second source/drain layer, so as to define an active region of the semiconductor device;
   forming a sacrificial gate in a recess formed by the periphery of the channel layer with respect to that of the first source/drain layer and the second source/drain layer;
   forming a dopant source layer on surfaces of the first source/drain layer and the second source/drain layer;
   driving dopants from the dopant source layer into the active region defined through the first source/drain layer and the second source/drain layer;
   removing the sacrificial gate and forming a gate stack surrounding the periphery of the channel layer; and
   introducing a stressed semiconductor layer into the second source/drain layer.

2. The method of claim 1, wherein disposing the stack comprises disposing the stack by epitaxy.

3. The method of claim 1, wherein defining an active region comprises:
   selectively etching the second source/drain layer, the channel layer, and the first source/drain layer in sequence; and
   further selectively etching the channel layer, so that the periphery of the channel layer is recessed with respect to that of the first source/drain layer and the second source/drain layer.

4. The method of claim 3, wherein the defined active region has a pillar shape, and the first source/drain layer after being etched has an upper portion in a pillar shape and a lower portion extending beyond a periphery of the pillar-shaped upper portion.

5. The method of claim 1, wherein the dopants not only move into the first source/drain layer and the second source/drain layer, but also move into end portions of the channel layer close to the first source/drain layer and the second source/drain layer.

6. The method of claim 1, further comprising:
forming an isolation layer surrounding the active region on the substrate, wherein the isolation layer has its top surface close to an interface between the channel layer and the first source/drain layer or at a level between a top surface and a bottom surface of the channel layer.

7. The method of claim 6, wherein forming a gate stack comprises:
forming a gate dielectric layer and a gate conductor layer on the isolation layer in sequence; and
etching back the gate conductor layer, wherein a portion of the gate conductor layer outside a recess formed by the periphery of the channel layer with respect to that of the first source/drain layer and the second source/drain layer has its top surface at a level lower than the top surface of the channel layer.

8. The method of claim 1, further comprising:
forming a liner on surfaces of the first source/drain layer and the second source/drain layer.

9. The method of claim 8, wherein introducing a stressed semiconductor layer into the second source/drain layer comprises:
selectively etching the liner to at least partially expose a top surface of the second source/drain layer;
selectively etching the second source/drain layer to at least partially remove the second source/drain layer; and
growing the stressed semiconductor layer with a remaining portion of the second source/drain layer or the channel layer as a seed.

10. The method of claim 9, wherein after selectively etching the liner and before selectively etching the second source/drain layer, the method further comprises,
forming a mask configured to cover at least a sidewall portion of the second source/drain layer.

\* \* \* \* \*